(12) United States Patent
Wang et al.

(10) Patent No.: US 8,142,704 B2
(45) Date of Patent: Mar. 27, 2012

(54) IMPRINT LITHOGRAPHY SYSTEM AND METHOD

(75) Inventors: Liang Wang, Austin, TX (US); Yeong-jun Choi, Cedar Park, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 357 days.

(21) Appl. No.: 12/575,907

(22) Filed: Oct. 8, 2009

(65) Prior Publication Data

US 2010/0096766 A1 Apr. 22, 2010

Related U.S. Application Data

(60) Provisional application No. 61/107,471, filed on Oct. 22, 2008.

(51) Int. Cl.
*B29C 59/00* (2006.01)

(52) U.S. Cl. ...... 264/293; 264/1.24; 264/40.1; 264/319; 425/385

(58) Field of Classification Search .................. 264/1.24, 264/40.1, 293, 319; 425/385
See application file for complete search history.

(56) References Cited

U.S. PATENT DOCUMENTS

| | | | |
|---|---|---|---|
| 2002/0005484 A1* | 1/2002 | Nishimura | 250/310 |
| 2010/0015270 A1* | 1/2010 | Choi et al. | 425/149 |

* cited by examiner

*Primary Examiner* — Christina Johnson
*Assistant Examiner* — Saeed Huda
(74) *Attorney, Agent, or Firm* — Cameron A. King

(57) ABSTRACT

A loading unit, surface scanning module, and an imprint module may be integrated into a single tool. Template may be loaded on loading unit and positioned within imprint module. Substrate may then be loaded on loading unit and scanned defects using surface scanning module. If substrate passes inspection by surface scanning module, substrate may be positioned imprint module where formable material may be dispensed thereon and imprinted. The imprinted substrate may then be unloaded from imprinting module.

20 Claims, 7 Drawing Sheets

IMPRINT LITHOGRAPHY SYSTEM AND METHOD

CROSS-REFERENCE TO RELATED APPLICATIONS

This application claims the benefit under 35 U.S.C. §119(e)(1) of U.S. Provisional Patent Application No. 61/107,471, filed Oct. 22, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields, while increasing the circuits per unit area formed on a substrate; therefore, nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. Additionally, the substrate may be coupled to a substrate chuck. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
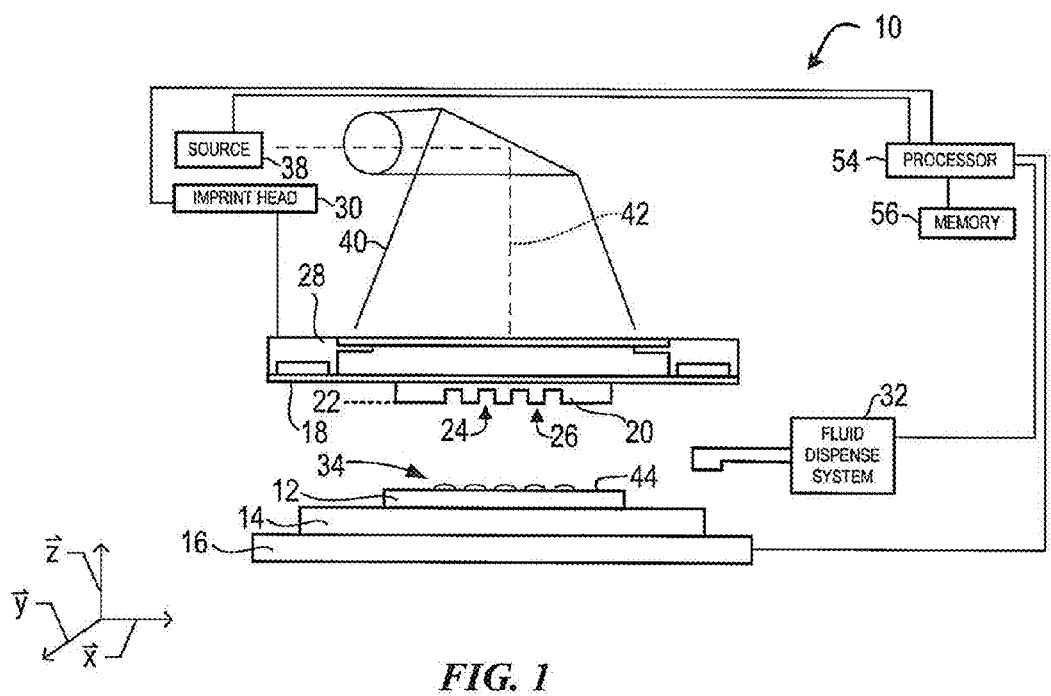
FIG. 1 illustrates a simplified side view of a lithographic system.

Referring to the Figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is herein incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Such chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
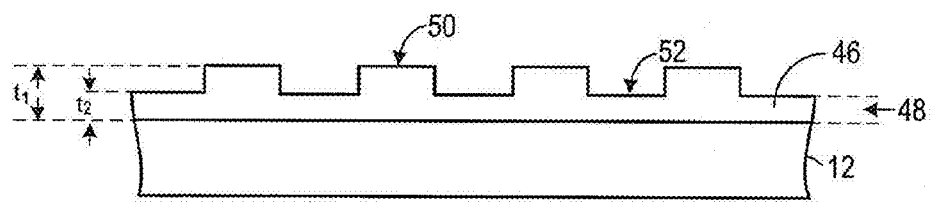
FIG. 2 illustrates a simplified side view of the substrate illustrated in FIG. 1, having a patterned layer thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g. ultraviolet radiation, causing formable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features such as protrusions 50 and recessions 52, with protrusions 50 having thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

As template 18 may be expensive to manufacture, replications of template 18 (i.e., replica templates 18a) may aid in reducing overall cost of ownership. In embodiments herein, apparatuses for surface inspection of replica templates 18a integrated with the replicating tool and corresponding process steps are presented. In-line surface inspection of replica template 18a may be a primary way to confirm cleanliness and/or particle-free condition of patterning surface 22a immediately prior to imprinting.

Currently, there is no known system or process that includes in-line surface inspection and mask replication for nano-imprinting. Generally, a stand-alone module that inspects masks is used, such as those seen within the art of optical lithography. Nano-imprint lithography processes have many unique issues, one of such being the importance of a clean substrate 12 substantially free from surface defects and/or particles. Inspection of substrate 12 and/or imprint head 30 for imprinting a pattern may be done in system 10 in order to minimize any additional contamination or additional particles.

Figure 3:
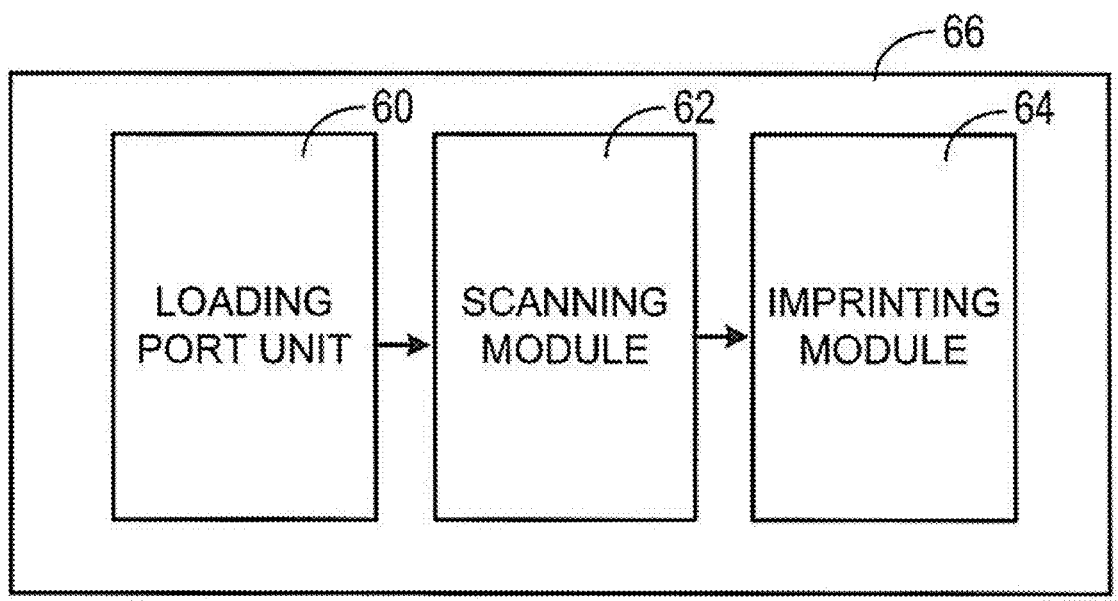
FIG. 3 illustrates a simplified block diagram of a template loading port.

Referring to FIGS. 1-3, embodiments herein integrate three sub-assembly units: a loading port 60, a scanning module 62 and an imprinting module 64 integrated into a single imprinting station 66. Sub-assembly units 60, 62 and 64 may provide for inspection of template 18 and/or replica template 18a immediately prior to imprinting. By integrating sub-assembly units 60, 62 and 64, loading, inspection, dispensing, imprinting, and separation may occur in imprinting station 66 minimizing exposure of template 18, replica template 18a and/or substrate 12 to particles (i.e., contaminments).

Figure 4A:
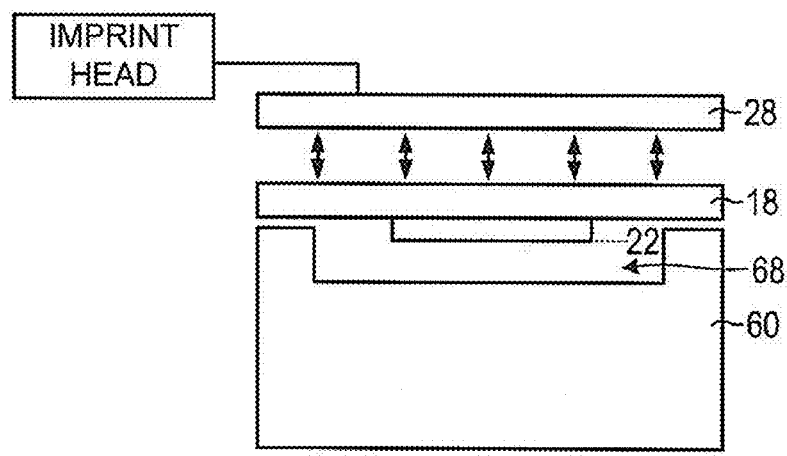
FIGS. 4A-4C illustrate a mask loading port having a surface scanning module for loading of replica templates.

Referring to FIG. 4A, loading port 60 of imprinting station 66 generally provides for loading and unloading of template 18 from imprint head 30. For example, during loading, template 18 may be positioned on loading port 60 with patterning surface 22 within a chamber 68. Chamber 68 may provide patterning surface 22 of template 18 to face the direction of patterning for loading/unloading of template 18 to/from chuck 28 (e.g., downward to interface with substrate 12 during imprinting). Chamber 68 may suspend patterning surface 22 such that patterning surface 22 is void of contact with loading port 60 during transport. As such, patterning surface 22 may suffer minimal damage during transport. The step height of patterning surface 22 from surrounding surface of template 18 may be approximately 0-100 microns.

Figure 4B:
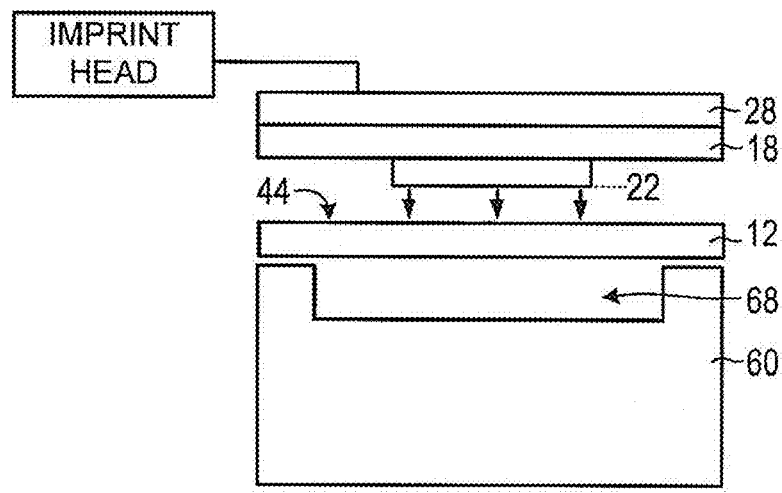

Referring to FIG. 4B, as loading port 60 is part of integrated system 66, loading port 60 may also be used to handle substrates 12. For example, subsequent to positioning of template 18 on chuck 28, substrate 12 may be loaded onto loading port 60 such that surface 44 of substrate 12 faces direction of patterning (e.g., upward to interface template 18. Substrate 12 may then be moved in superimposition with template 18 for patterning as described in relation to FIGS. 1 and 2.

Figure 4C:
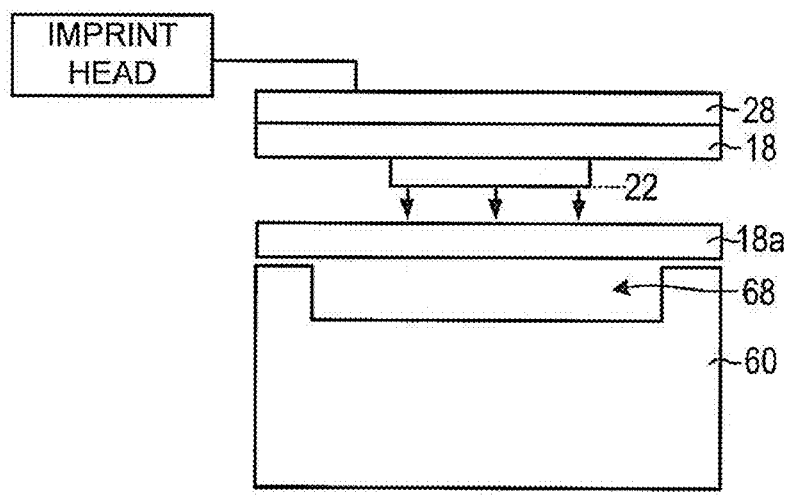

Referring to FIG. 4C, additionally, loading port 60 may be used to handle replica template 18a. For example, replica template 18a may be loaded onto loading port 60 for imprinting by template 18 (i.e., during formation of patterning surface 22a of replica template 18a). In some cases, replica template 18a may have replicating surface 22a, formed by a step from its surrounding surface. The step height may be approximately 0-100 microns.

Loading port 60 may include characteristics of loading apparatus further described in U.S. Ser. Nos. 11/565,350, 11/625,082, 11/211,766, 11/292,798, 10/437,476, 10/438,224, all of which are hereby incorporated by reference in their entirety.

Figure 5A:
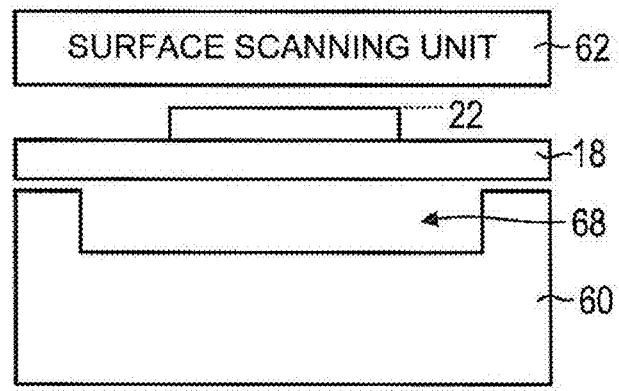
FIGS. 5A-5C illustrate exemplary surface scanning modules.
Figure 5B:
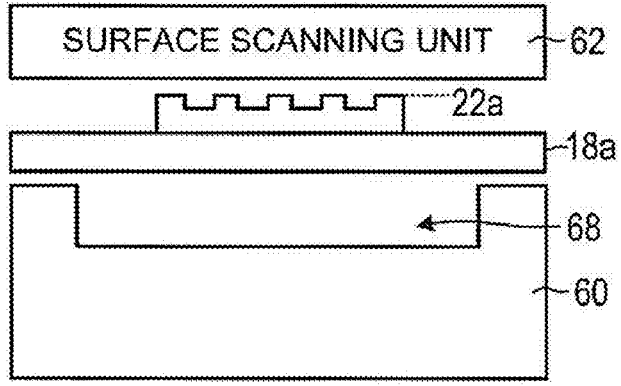
Figure 5C:
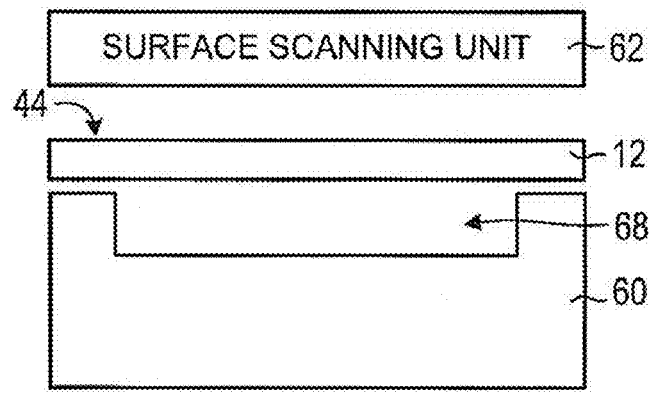

Referring to FIGS. 5A-5C, surface scanning module 62 may be used to detect surface contamination and/or defects affecting quality of template 18, replica template 18a, and/or substrate 12. Surface scanning module 62 may include characteristics of particle detection systems and methods further described in U.S. Ser. Nos. 11/737,301, 10/996,126 and 12/392,663, all of which are hereby incorporated by reference in their entirety.

Figure 6A:
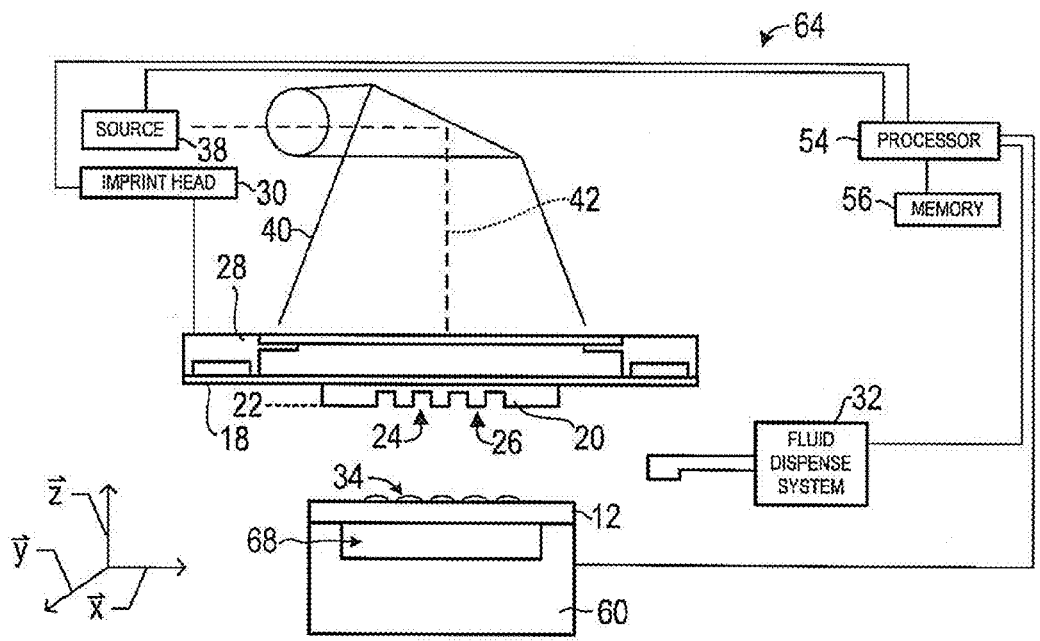
FIGS. 6A-6B illustrate exemplary imprinting modules.
Figure 6B:
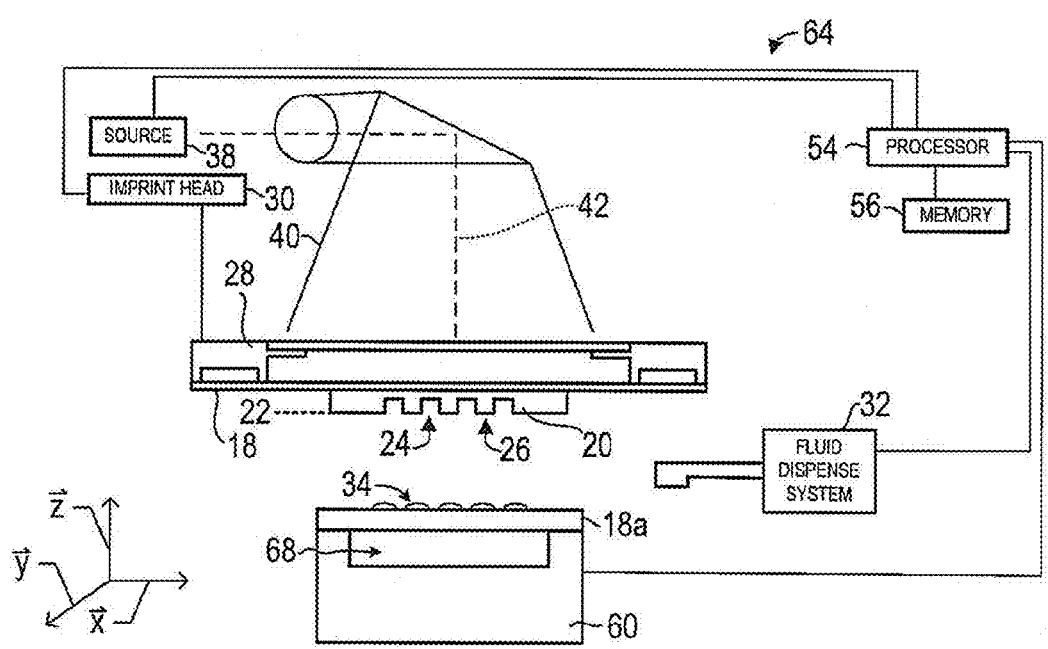

Referring to FIGS. 6A and 6B, imprinting module 64 may include a fluid dispense system 38 in addition to components of system 10 used in imprinting as described in relation to FIGS. 1 and 2. FIG. 6A illustrates use of imprinting module 64 with substrate 12 on loading port 60. FIG. 6B illustrates use of imprinting module 64 with replica template 18a on loading port 60. Drops of formable material 34 may be dispensed on substrate 12 or replica template 18a used in fluid dispense system 38 and patterned as illustrated and described in relation to FIGS. 1 and 2.

It should be noted that the shape of template 18, replica template 18a and/or substrate 12 may be modulated. For example, shape may be modulated to minimize any shearing distortion the interface for imprinting (e.g., surface 44 of substrate, patterning surface 22 of template 18 and the like). Modulation of shape may use systems and methods as described in U.S. Ser. Nos. 10/864,591, 10/316,963, and 11/389,731, all of which are hereby incorporated by reference in their entirety. Additionally, a shape modulation control unit may be integrated into imprinting station 66.

Figure 7:
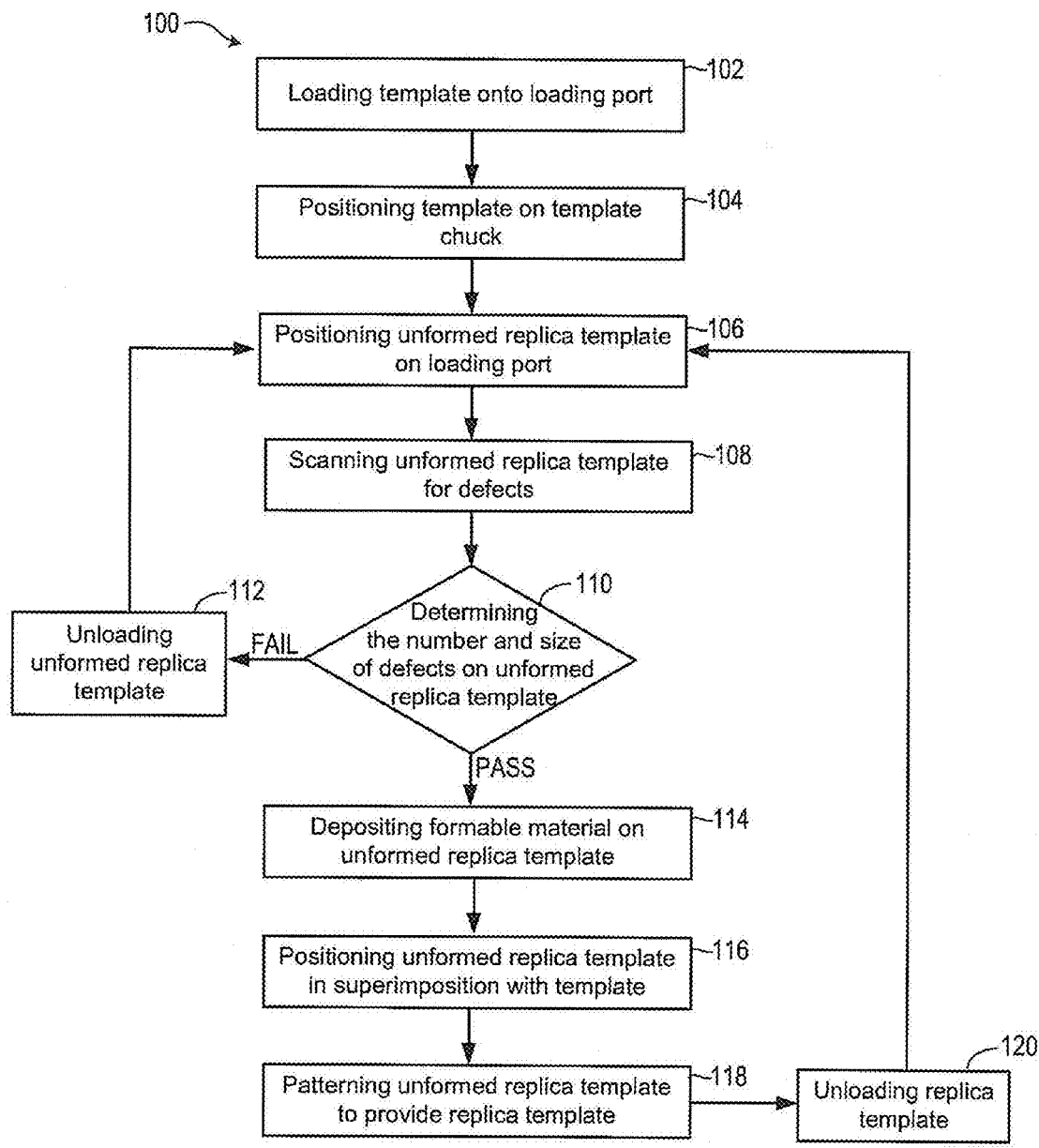
FIG. 7 illustrates a flow diagram of an exemplary method for loading of replica templates.

FIG. 7 illustrates a flow chart of an exemplary method 100 for forming replica template 18a using imprinting station 66. In a step 102, template 18 may be positioned on loading port 60. For example, template 18 may be positioned on loading port 60 such that patterning surface 22 is within chamber 68. In a step 104, template 18 may be positioned on chuck 28. In a step 106, unformed replica template 18a may be positioned on loading port 60. Unformed replica template 18a may be positioned such that the surface to be patterned is positioned toward surface scanning module 62. In a step 108, the surface of unformed replica template 18a to be patterned may be scanned for particles and/or defects. In a step 110, the number and size of the defects may be determined. The number and size of defects may determine if unformed replica template 18a substrate passes or fails inspection. For example, if FAIL is the result, unformed replica template 18a may be unloaded as provided in step 112 and another replica template may be loaded in its place as indicated by step 106. If PASS is the result, then replica template 18a may be positioned such that formable material 34 may be dispensed thereon as provided in step 114. In step 116, unformed replica template 18a may be positioned in superimposition with template 18. In a step 118, unformed replica template 18a may be patterned using template 18 to form replica template 18a. In a step 120, replica template 18a may be unloaded and another unformed replica template 18a may be loaded in its place.

Figure 8:
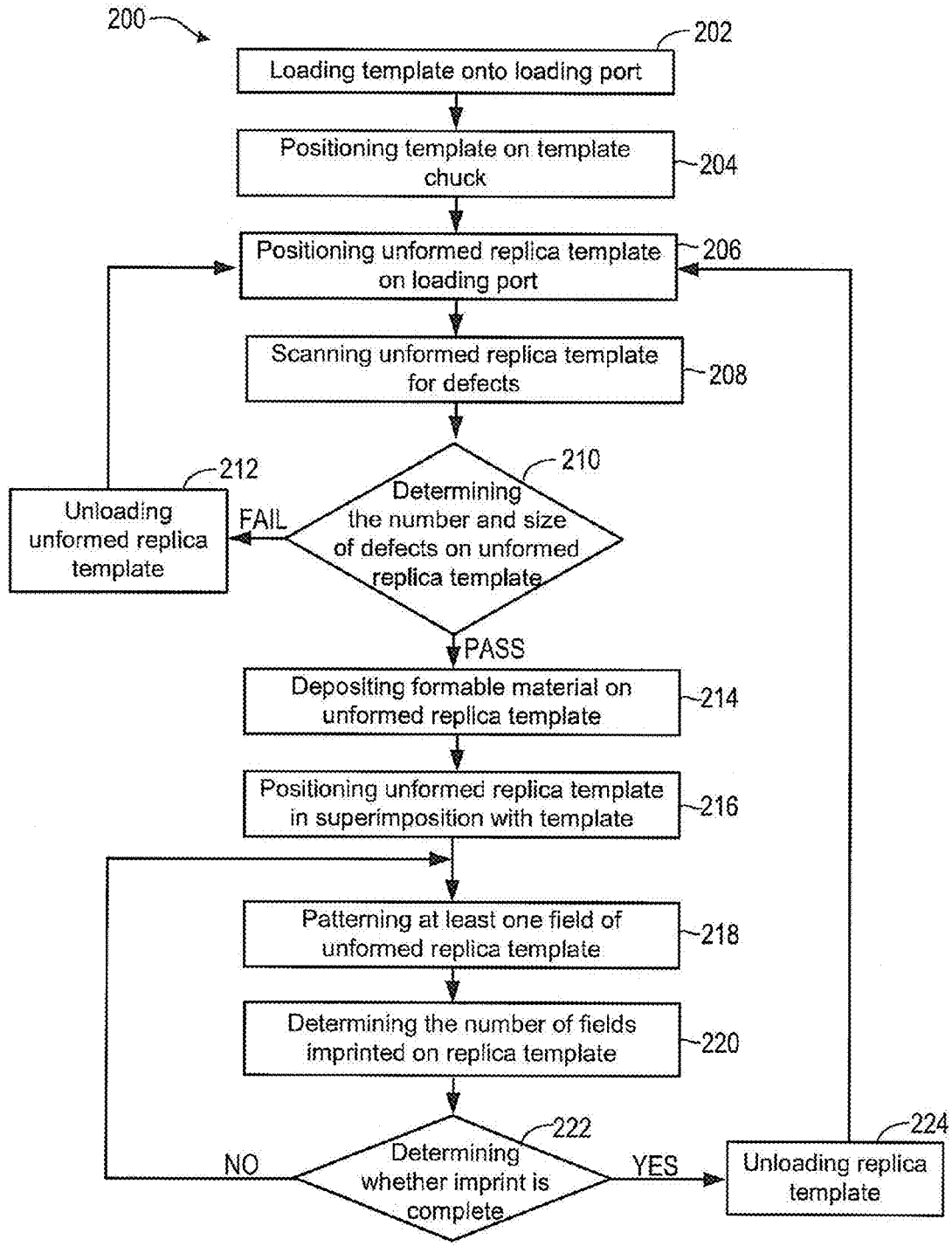
FIG. 8 illustrates a flow diagram of another exemplary method for loading of replica templates.

FIG. 8 illustrates a flow chart of an exemplary method 200 for forming replica template 18a using imprinting station 66. In this method, dimensions of mesa 20 of template 18 may be substantially smaller than mesa 20a of resulting replica template 18a. As such, replica template 18a may be repeatedly imprinted (e.g., step and repeat imprinting) using template 18. In a step 202, template 18 may be positioned on loading port 60. For example, template 18 may be positioned on loading port 60 such that patterning surface 22 is within chamber 68. In a step 204, template 18 may be positioned on chuck 28. In a step 206, unformed replica template 18a may be positioned on loading port 60. Unformed replica template 18a may be positioned such that the surface to be patterned is positioned toward surface scanning module 62. In a step 208, the surface of unformed replica template 18a to be patterned may be scanned for particles and/or defects. In a step 210, the number and size of the defects may be determined. The number and size of defects may determine if replica template 18a substrate passes or fails inspection. For example, if FAIL is the result, unformed replica template 18a may be unloaded as provided in step 212 and another replica template may be loaded in its place. If PASS is the result, then replica template 18a may be positioned such that formable material 34 may be dispensed thereon as provided in step 214. In step 216, unformed replica template 18a may be positioned in superimposition with template 18. In a step 218, at least one field of unformed replica template 18a may be patterned using template 18 to form replica template 18a. In step 220, the number of fields imprinted may be determined. In a step 222, the number of fields determined may provide whether imprinting of replica template 18a is complete. If the result is YES, then in step 224, replica template 18a may be unloaded for further processing. If the result is NO, at least one additional field of unformed replica template 18a may be patterned.

What is claimed is:

1. A method for patterning a substrate using an imprint lithography template, comprising:
    positioning the imprint lithography template on a loading port;
    unloading the imprint lithography template from the loading port to an imprinting module, wherein unloading includes positioning the imprint lithography template on a template chuck within the imprinting module;
    positioning a substrate on the loading port;
    scanning a surface of the substrate for particles and defects using a surface scanning module;
    positioning the substrate in superimposition with the template within the imprinting module;
    patterning at least one field of the substrate; and,
    unloading the substrate from the loading port, wherein the loading port, surface scanning module, and imprint module are integrated in a single imprinting station reducing exposure of the imprint lithography template and substrate to particles.

2. The method of claim 1, further comprising:
    determining a threshold amount for particle and defect presence on the surface of the substrate; and,
    determining whether particles and defects provided by the scan exceed the threshold amount.

3. The method of claim 1, wherein the template is a master template and the substrate is a replica template.

4. The method of claim 1, wherein the template is a replica template.

5. The method of claim 1, further comprising modulating shape of the template to conform to the substrate using a shape modulation control module.

6. The method of claim 5, wherein the shape modulation control module is integrated in the single imprinting station.

7. The method of claim 1, wherein the imprinting module includes a fluid dispense system.

8. The method of claim 7, wherein patterning at least one field of the substrate includes:
    depositing, by the fluid dispense system, formable material on the field of the substrate;
    contacting the template to the formable material;
    applying energy to the formable material to form a patterned layer on the substrate; and,
    separating the template from the patterned layer.

9. The method of claim 1, wherein scanning the surface of the substrate for particles and defects is immediately prior to positioning the substrate in superimposition with the template.

10. The method of claim 1, wherein the substrate is a disk.

11. The method of claim 1, wherein the substrate is a wafer.

12. The method of claim 1, wherein the substrate is a solar cell.

13. A method of patterning a substrate using an imprint lithography template, comprising:
    positioning the imprint lithography template on a loading port;
    unloading the imprint lithography template from the loading port to an imprinting module, wherein unloading includes positioning the imprint lithography template on a template chuck within the imprinting module;
    positioning a substrate on the loading port;
    scanning a surface of the substrate for particles and defects using a surface scanning module;
    positioning the substrate in superimposition with the template within the imprinting module;
    patterning the substrate using a step and repeat process; and,
    unloading the substrate from the loading port, wherein the loading port, surface scanning module, and imprint module are integrated in a single imprinting station reducing exposure of the imprint lithography template and substrate to particles.

14. The method of claim 13, further comprising:
    determining a threshold amount for particle and defect presence on the surface of the substrate; and,
    determining whether particles and defects provided by the scan exceed the threshold amount.

15. The method of claim 13, wherein the template is a master template and the substrate is a replica template.

16. The method of claim 13, wherein the template is a replica template.

17. The method of claim 1, wherein the imprinting module includes a fluid dispense system.

18. The method of claim 17, wherein patterning at least one field of the substrate includes:
    depositing, by the fluid dispense system, formable material on the field of the substrate;

contacting the template to the formable material;

applying energy to the formable material to form a patterned layer on the substrate; and, separating the template from the patterned layer.

19. A method of patterning a substrate using an imprint lithography template, comprising:

loading the imprint lithography template on a first sub-assembly module;

inspecting the imprint lithography template using a second sub-assembly module;

unloading the imprint lithography template from the first sub-assembly module to the third sub-assembly module;

loading the substrate on the first sub-assembly module;

inspecting the substrate using the second sub-assembly module; and patterning the substrate using the imprint lithography template within the third sub-assembly module, wherein the first sub-assembly module, the second sub-assembly module, and the third sub-assembly module are a single imprinting station.

20. The method of claim 19, wherein the first sub-assembly module is a loading port, the second sub-assembly module is a surface scanning module, and the third sub-assembly module is an imprinting module.

* * * * *